United States Patent
Deng et al.

(10) Patent No.: US 7,264,976 B2
(45) Date of Patent: Sep. 4, 2007

(54) ADVANCE RIDGE STRUCTURE FOR MICROLENS GAPLESS APPROACH

(75) Inventors: Jack Deng, Hsin-Chu (TW); Chin Chen Kuo, Hsin-Chu (TW); Fu-Tien Weng, Hsin-Chu (TW); Chih-Kung Chang, Hsin-Chu (TW); Bii-Junq Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/064,452

(22) Filed: Feb. 23, 2005

(65) Prior Publication Data
US 2006/0189062 A1   Aug. 24, 2006

(51) Int. Cl.
*H01L 21/00* (2006.01)

(52) U.S. Cl. .................. 438/7; 438/24; 438/48; 438/70; 438/73; 438/698; 257/E33.068

(58) Field of Classification Search ........ 438/7–11, 438/48, 22–29, 69–74, 697–698, 760
See application file for complete search history.

(56) References Cited

U.S. PATENT DOCUMENTS

| 5,593,913 A | | 1/1997 | Aoki |
| 5,900,655 A | * | 5/1999 | Shim .................... 257/232 |
| 6,043,481 A | * | 3/2000 | Tan et al. ............... 250/216 |
| 6,221,687 B1 | | 4/2001 | Abramovich |
| 6,803,250 B1 | | 10/2004 | Yaung et al. |
| 7,052,921 B1 | * | 5/2006 | Plat et al. ................ 438/14 |
| 2004/0263665 A1 | * | 12/2004 | Yamamoto ............. 348/335 |
| 2005/0200960 A1 | * | 9/2005 | Tang ...................... 359/619 |
| 2005/0287479 A1 | * | 12/2005 | Moon ..................... 430/330 |

OTHER PUBLICATIONS

Ghandhi, VLSI Fabrication Principles, 1983, John Wiley & Sons, pp. 542-546.*

* cited by examiner

Primary Examiner—H. Jey Tsai
(74) Attorney, Agent, or Firm—Haynes and Boone, LLP (57) ABSTRACT

A method of manufacturing a plurality of microlenses on a substrate comprises forming a grid having raised ridges defining a plurality of openings on the substrate and forming a plurality of patterned photoresist features each disposed within one of the plurality of openings. The plurality of patterned photoresist features can then be reflowed inside the grid.

3 Claims, 8 Drawing Sheets

ADVANCE RIDGE STRUCTURE FOR MICROLENS GAPLESS APPROACH

RELATED APPLICATIONS

This application is related to U.S. patent application Ser. No. 10/821,141, filed on Apr. 8, 2004 and U.S. patent application Ser. No. 10/939,894, filed on Sep. 13, 2004.

BACKGROUND

The present disclosure relates generally to microdevices and, more specifically, to microlenses.

Microlens arrays are widely employed in image sensor technology, such as charged coupling device (CCD) image sensors and complimentary metal-oxide-semiconductor (CMOS) image sensors. In general, CCD, CMOS, and other types of microlens arrays transform a light pattern (e.g., a pixel image) into an electric charge pattern.

Microlens arrays generally include polymer or dielectric microlenses. Polymer microlenses can be formed by patterning a polymer layer and subsequently thermal reflowing the patterned polymer layer to create the required shape of each microlens.

However, when pixel size is decreased and/or microlens packing density is increased, the processing window for creating and using the microlens arrays is narrowed down accordingly. As a result, process operations can become more difficult. For example, a thermal reflow process can become problematic due to the potential merging of neighboring microlenses.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
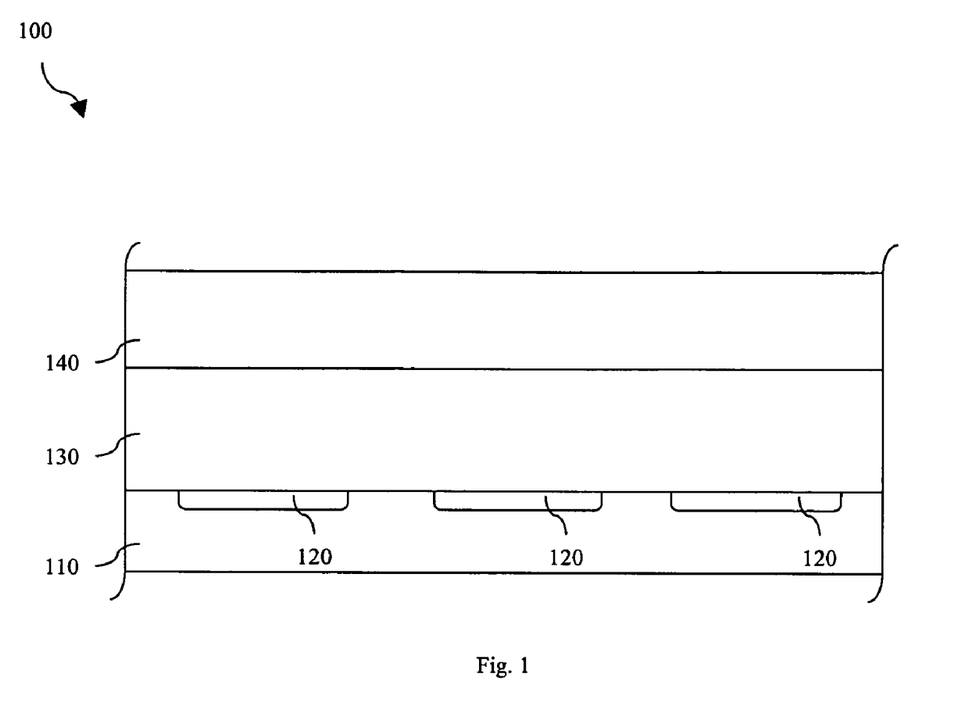
FIGS. 1, 2, 3a, 4, 5a, 6, 7a, and 8 illustrate sectional views of one embodiment of a microlens array during various fabrication stages.

Referring to FIG. 1, illustrated is a sectional view of one embodiment of a semiconductor device 100 constructed according to aspects of the present disclosure. The semiconductor device 100 may include a substrate 110 and photo sensors 120 formed therein.

The substrate 110 may comprise an elementary semiconductor such as silicon, germanium, and diamond. The substrate 110 may also comprise a compound semiconductor such as silicon carbide, gallium arsenic, indium arsenide, and indium phosphide. The substrate 110 may comprise an alloy semiconductor such as silicon germanium, silicon germanium carbide, gallium arsenic phosphide, and gallium indium phosphide. The substrate 110 may include an epitaxial layer. For example, the substrate may have an epitaxial layer overlying a bulk semiconductor. Further, the substrate 110 may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process such as selective epitaxial growth (SEG). Furthermore, the substrate 110 may comprise a semiconductor-on-insulator (SOI) structure. For examples, the substrate may include a buried oxide (BOX) layer formed by a process such as separation by implanted oxygen (SIMOX). The substrate 110 may comprise a p-type doped region and/or an n-type doped region. All doping may be implemented by a process such as ion implantation. The substrate 110 may comprise lateral isolation features to separate different devices formed on the substrate. In one embodiment, the substrate 110 may also include a doped epitaxial layer, a multiple silicon structure, or a multilayer, compound semiconductor structure.

The photo sensors 120 may be photodiodes and/or other sensors diffused or otherwise formed in the substrate 110. Aspects of the present disclosure are applicable and/or readily adaptable to microlens arrays employing charged coupling device (CCD) and complimentary metal-oxide-semiconductor (CMOS) image sensor applications (e.g., active-pixel sensors), as well an non-active sensors. As such, the photo sensors 120 may comprise conventional and/or future-developed image sensing devices. Moreover, the photo sensors 120 may comprise color image sensors and/or monochromatic image sensors.

The semiconductor device 100 may include a passivation layer 130. The passivation layer 130 may comprise silicon nitride (e.g., $Si_3N_4$), silicon oxynitride (e.g., $Si_xN_yO_z$), silicon oxide, silicon dioxide, and/or other proper materials. The passivation layer 130 may be substantially transparent (for a desired wavelength), and may be formed by chemical vapor deposition (CVD), physical vapor deposition (PVD), atomic layer deposition (ALD), spin-on coating, and/or other suitable processes. In one embodiment, the passivation layer 130 has a thickness ranging between about 1 µm and about 50 µm. The passivation layer 130 may further comprise a multilayer interconnect structure formed therein. The multilayer interconnect may include metal lines for lateral connections and via/comtact features for vertical connections. The metal lines and via/contact features may be configured such that the photo sensors 120 may not be blocked thereby from incident light. The passivation layer 130 may have a multilayer structure such as a layer having the multilayer interconnects embedded therein and a layer to protect the underlying interconnects and the substrate.

The semiconductor device 100 may include a dielectric layer 140. The dielectric layer 140 may comprise silicon nitride, silicon oxynitride, silicon oxide, resin, polymer, combinations thereof, and/or other suitable materials. The dielectric layer 140 may also comprise a low-k dielectric layer having a dielectric constant less than or equal to about 3.9. The dielectric layer 140 may be formed by CVD, PVD, ALD, spin-on coating, and/or other proper methods. The dielectric layer 140 may have a multilayer structure including a planarization layer, color filter layer, and/or a spacer layer in one example. The dielectric layer 140 may be formed by a method described above and may be substantially planar, possibly the result of chemical-mechanical-polishing (CMP). The color filters may be positioned such that the incident light is directed thereon and therethrough. In one embodiment, such color-transparent layers may comprise a polymeric material (e.g., negative photoresist based on an acrylic polymer) or resin. The color filter layer may comprise negative photoresist based on an acrylic polymer including color pigments. The spacer layer is formed to adjust the distance between the overlying microlens array and the underlying photo sensors 120. In one embodiment, the dielectric layer 140 has a thickness ranging between about 0.2 μm and 50 μm.

Figure 2:
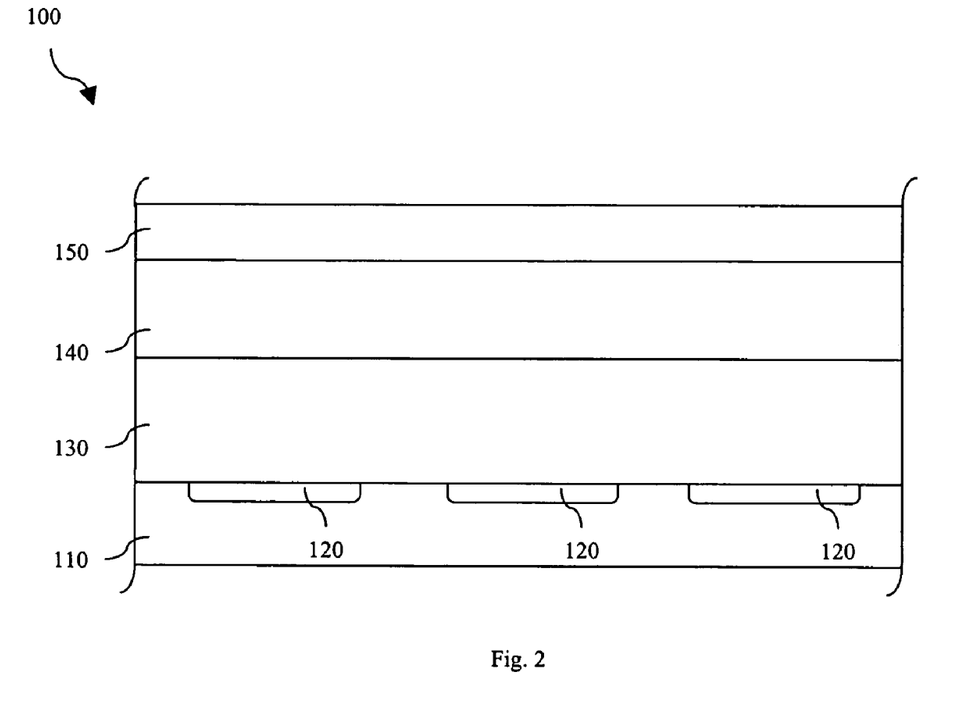

Referring to FIG. 2, illustrated is a sectional view of one embodiment of the semiconductor device 100 during a manufacturing stage. A photoresist layer 150 may be formed over the semiconductor device 100, using a method such as spin-on coating. In one example, the photoresist layer 150 may comprise a positive photoresist to define a smaller feature. The photoresist 150 layer may be pre-baked before the next process step.

Figure 3A:
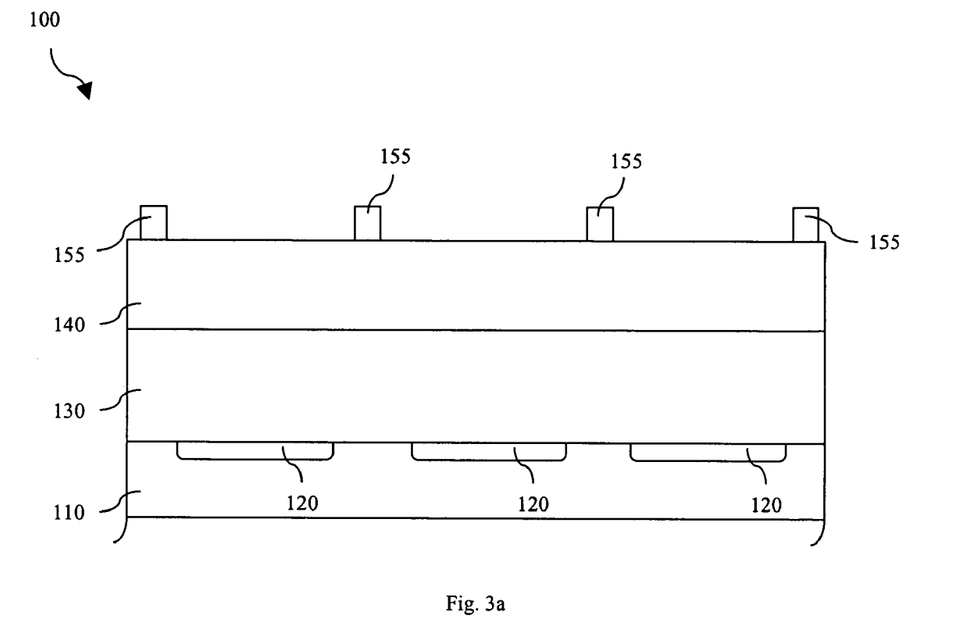
Figure 3B:
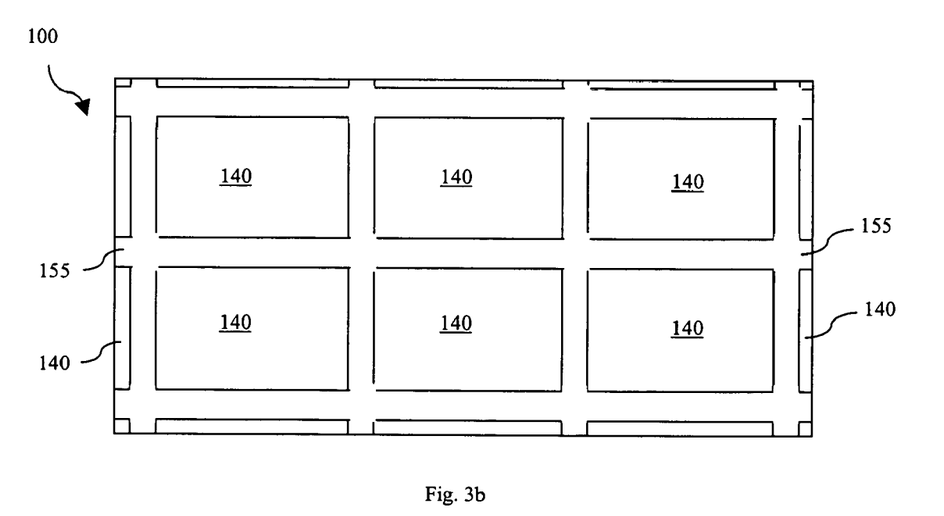
FIGS. 3b, 5b, and 7b illustrate top views of one embodiment of a microlens array during various fabrication stages.

Referring to FIGS. 3a and 3b, illustrated are a sectional view and a top view, respectively, of one embodiment of the semiconductor device 100 during a manufacturing stage. The photoresist layer 150 is exposed and then developed to form a photoresist pattern 155 predefined in a photomask. The photoresist patterning process may further comprise a post-baking step between the exposing and developing, and/or a hard-baking step after the developing. The photoresist patterning process may also be implemented or replaced by other proper methods such as maskless photolithography, electron-beam writing, ion-beam writing, and molecular imprint. The photoresist pattern 155 may comprise a wall structure. In one example, the photoresist pattern 155 has walls of a thickness ranging between about 0.2 μm and 0.25 μm.

Figure 4:
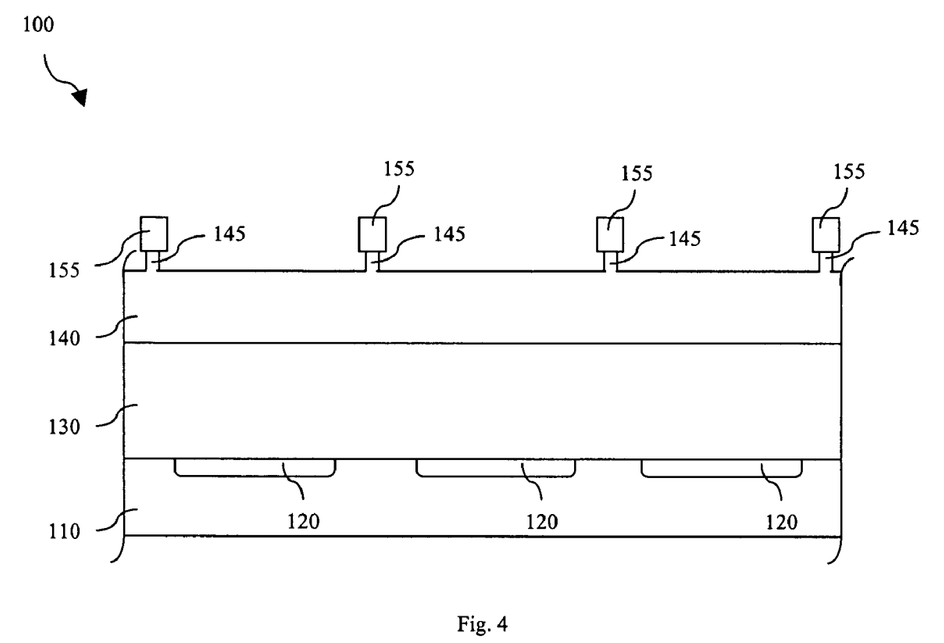

FIG. 4 illustrates a top view of one embodiment of the semiconductor device 100 during a manufacturing stage. The dielectric layer 140 is partially removed under the protection of the photoresist pattern 155 to form a grid 145 having raised ridges, using a process including dry etch and wet etch. In one embodiment, the grid 145 can be made during the patterning used to form the photoresist pattern 155. Also, the dielectric layer 140 can be partially removed such that the grid 145 is formed under the photoresist pattern 155. The raised ridges of the grid 145 may have a width less than the width of the photoresist pattern 155 because the etching method can also cause lateral removal of the dielectric layer 140 underlying the photoresist pattern 155. For example, the raised ridges of the grid 145 may have a width of about 0.1 to 0.15 μm while the walls of the photoresist pattern 155 have a width ranging from about 0.2 μm and about 0.25 μm.

Figure 5A:
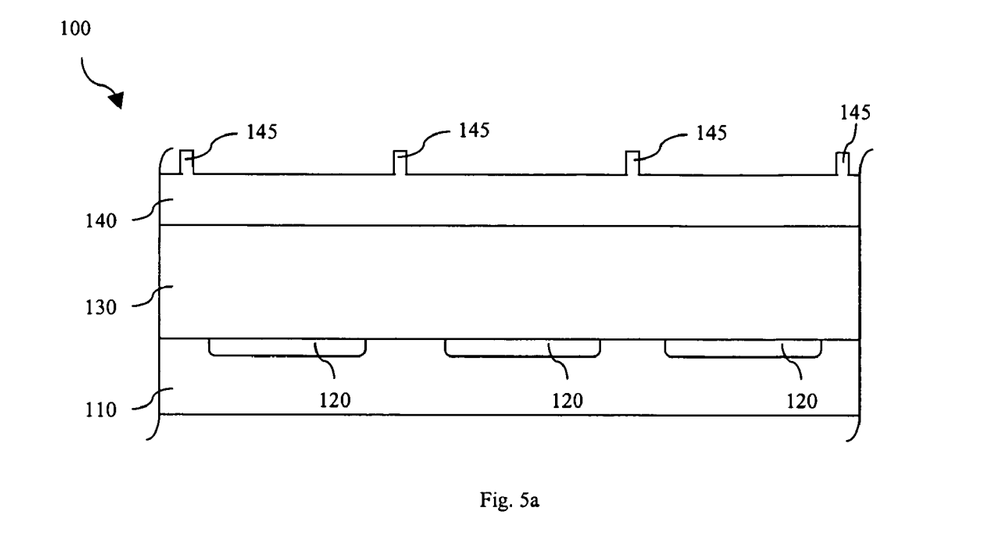
Figure 5B:
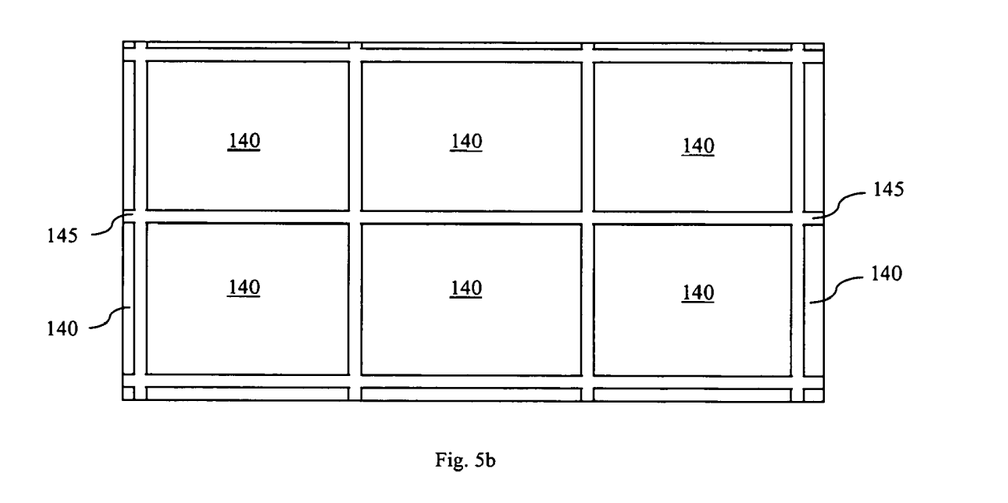

FIGS. 5a and 5b illustrate a sectional view and a top view, respectively, of one embodiment of the semiconductor device 100 during a manufacturing stage. The photoresist pattern 155 is removed after the grid 145 is formed. The removal of the photoresist pattern 155 may be implemented by a method including plasma ashing and wet stripping.

The grid 145 having raised ridges defines a plurality of openings on the substrate 110, where each opening comprises an exposed area of the dielectric layer 140 defined by the raised ridges. The shape of each opening may include, but not limited to, square, rectangular, oval, or round. The raised ridges may have enough height such that a later-formed microlens can be isolated form each other without merging. The actual height and width of the raised ridges may depend on manufacturing technology and design specification. The raised ridges may have different shapes depending on design requirements and manufacturing technologies. For example, the raised ridges may have vertical or sloped sidewalls which are tunable by the etching process used to partially remove the dielectric layer 140.

Figure 6:
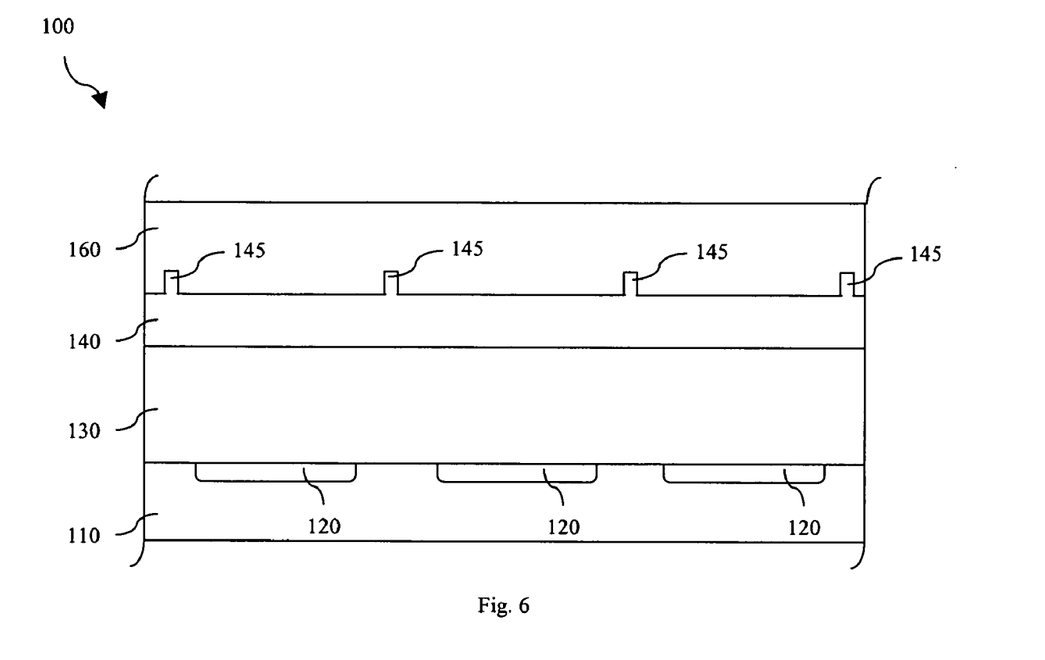

Referring to FIG. 6, illustrated is a sectional view of one embodiment of the semiconductor device 100 during a manufacturing stage. A photoresist layer 160 may be formed over the semiconductor device 100, using a method such as spin-on coating. The photoresist 160 layer may be pre-baked before proceeding to the next process step.

Figure 7A:
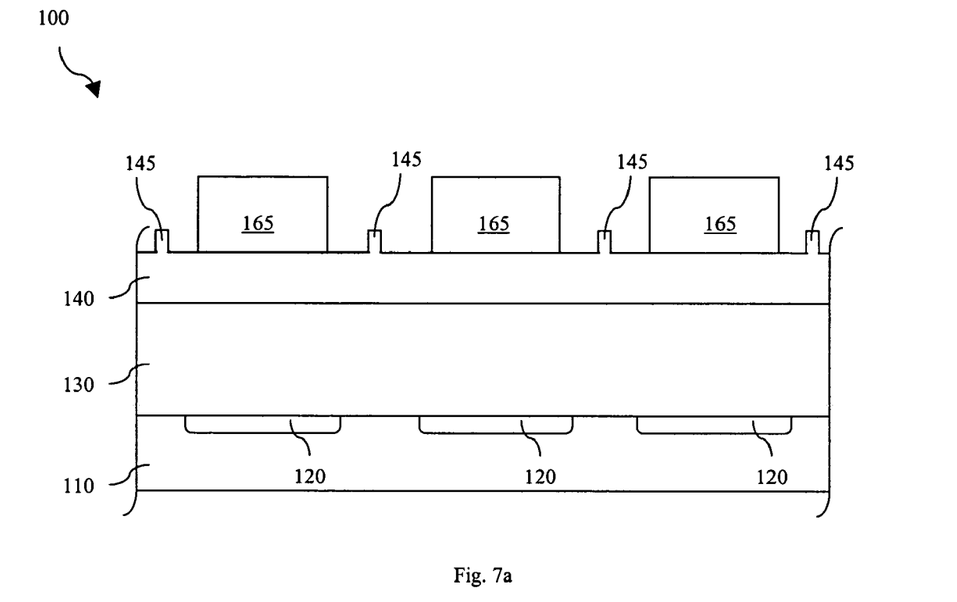
Figure 7B:
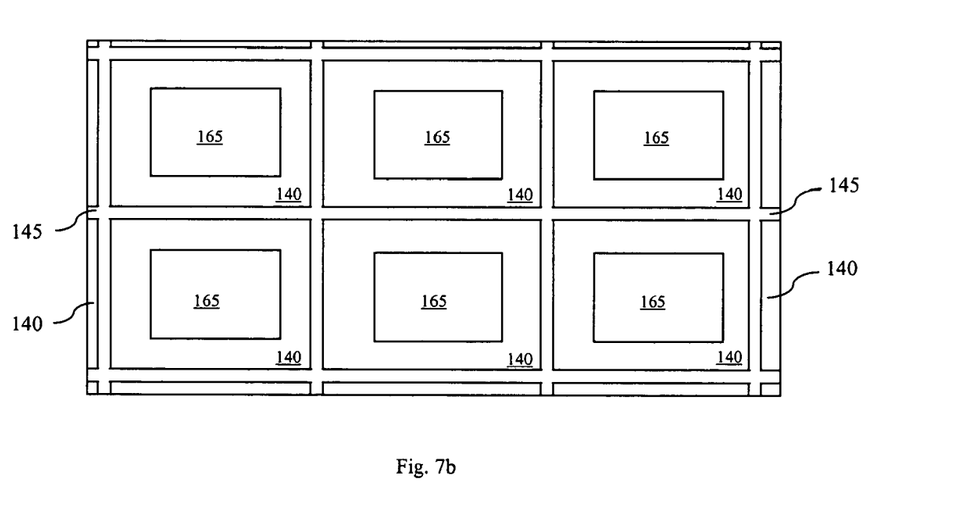

Referring to FIGS. 7a and 7b, illustrated are a sectional view and a top view, respectively, of one embodiment of the semiconductor device 100 during a manufacturing stage. The photoresist layer 160 is exposed and then developed to form a plurality of photoresist features 165, defined by a pre-designed photomask. Each of the photoresist features 165 is separated from others by the raised ridges of the grid 145. Although not required, the plurality of photoresist features 165 may be formed and disposed such that there may be a gap between the photoresist features 165 and the raised ridges of the grid 145. The photoresist features 165 may have a different shape such as a square, rectangular, and round. The shape of the photoresist features 165 may not be necessarily in compliance with the shape of the openings defined by the raised ridges of the grid 145. The surface profile of the photoresist features 165 may not be flat and can be controllable using the photolithography process and predesigned patterns of the photomask used to form the photoresist features 165. Other processing steps may be implemented such as baking after the exposing and/or the developing. The photoresist features may have a thickness more than that of the raised ridges of the grid 145. The formation of the photoresist features 165 may not be limited to the conventional photolithography technologies. Other alternatives may include maskless photolithography, electron-beam writing, ion-beam writing, and molecular imprint.

Figure 8:
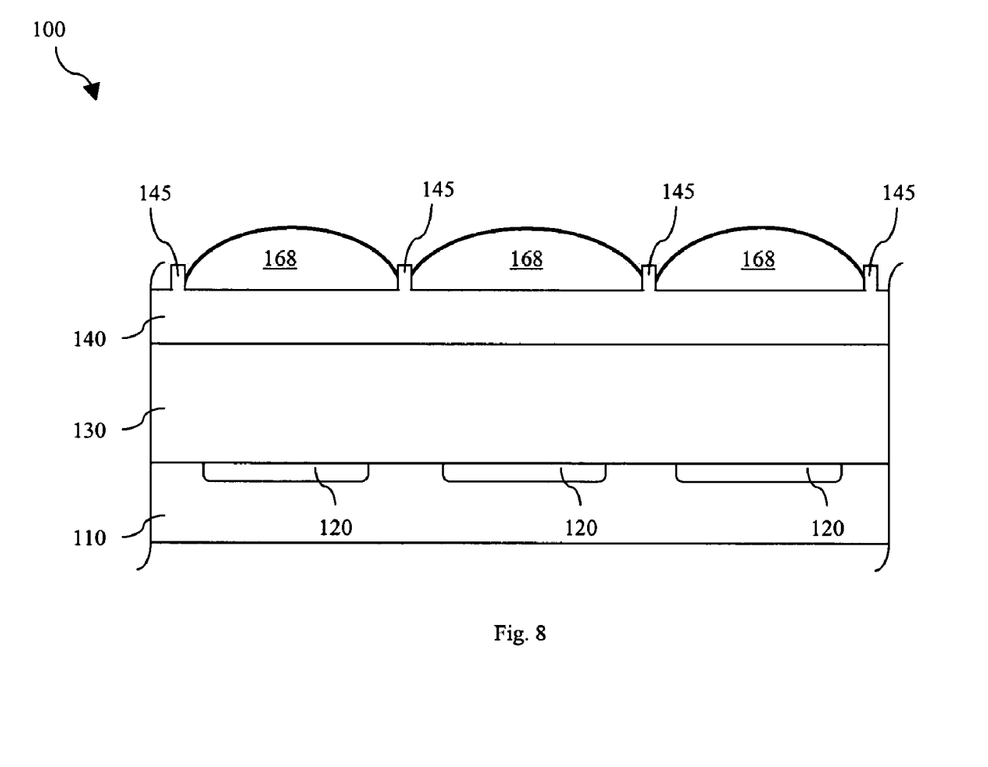

Referring to FIG. 8, illustrated is a sectional view of one embodiment of the semiconductor device 100 during a manufacturing stage. The plurality of photoresist features 165 are reflowed to form a plurality of microlenses 168 by a process such as a thermal reflow. The thermal reflow process may have a temperature range and profile, and duration depending on the photoresist type and expected curvature of the microlenses to be formed. In one example, the thermal reflowing may have a temperature range of about 70° C. to 140° C. and a duration of about a few seconds to about one hour. In another example, the thermal reflow process may be combined with a baking process such as a hard-baking process. In one example, each microlens 168 may have convex surface. Each microlens 168 may extend to reach the edge of the raised ridges of the grid 145 without gap there between and without merging to other microlenses. In one example, each microlens 168 may have a thickness at its center of about 0.5 to 0.7 μm. Thus formed, microlenses 168 may be substantially transparent to a light from an object to be imaged or detected during operation of the semiconductor device 100, or at least substantially transparent to a potion of the light within a desired range of wavelength. Due to the raised ridges of the grid 145, there will be reduced or eliminated merging between the adjacent microlenses 148.

The semiconductor device 100 may further comprise antireflective coating layers formed underlying and/or overlying the plurality of microlenses 165 for optimized imaging effect.

Thus, the present disclosure provides a method of making a plurality of microlenses on a substrate. In one embodiment, the method comprises forming a grid having raised ridges defining a plurality of openings on the substrate and forming a plurality of patterned photoresist features disposed within the plurality of openings. The patterned photoresist can then be reflowed with improved results.

In some embodiments, the formation of the grid having raised ridges comprises forming a photoresist layer on the substrate, exposing the photoresist layer using a predefined pattern, and partially etching the substrate to form a grid having raised ridges defining a plurality of openings on the substrate. The photoresist layer can be removed after partially etching the substrate.

In some embodiments, the formation of the grid having raised ridges may comprise forming raised ridges having a width and/or a height, respectively, of about 0.05 to 1 micrometer, or preferably of about 0.1 to 0.15 micrometer.

In some embodiments, the method may further comprise pre-baking the photoresist layer before exposing the photoresist layer, post-baking the photoresist layer after exposing the photoresist layer, developing the photoresist layer after post-baking the photoresist layer, and hard-baking the photoresist layer after developing the photoresist layer. In some embodiments, the photoresist layer used to define the raised ridges of the grid may comprise a positive photoresist material.

In some embodiments, a plurality of patterned photoresist features may be formed by a second photoresist layer on the substrate. The second photoresist layer is exposed and developed to form a plurality of patterned photoresist features. Baking may also be used.

In some embodiments, the reflow process may be a thermal reflow process. This can be used to form a plurality of patterned photoresist features each having a curved surface.

The present disclosure also provides a method of manufacturing a plurality of microlenses on a substrate having a plurality of photo sensors disposed therein. In one embodiment, the method comprises forming a first photoresist layer having a predefined pattern on the substrate and partially etching the substrate to form a grid having raised ridges defining a plurality of openings on the substrate. The first photoresist layer can be removed after partially etching the substrate and a plurality of patterned photoresist features can be formed within the plurality of openings. The photoresist features can be modified, such as using thermal reflow, to form a desired lens shape.

The present disclosure also provides a method of manufacturing a plurality of microlenses on a substrate having a plurality of photo sensors disposed therein. In one embodiment, the method comprises forming a dielectric layer over a layer of color filter disposed in the substrate, forming a photoresist layer having a predefined pattern on the dielectric layer, and partially etching the dielectric layer to form a grid having raised ridges defining a plurality of openings on the substrate. The photoresist layer can be removed after partially etching the substrate. A plurality of patterned photoresist features can be formed within the plurality of openings. The photoresist features can be modified, such as using thermal reflow, to form a desired lens shape.

The present disclosure also provides a microlens device disposed on a substrate having a photo sensor located therein. In one embodiment, the microlens device comprises a grid having raised ridges defining an opening on the substrate, and a patterned photoresist feature having a curved surface and being disposed within the opening. The grid having raised ridges may comprise a material selected from the group consisting of silicon oxide, silicon nitride, and silicon oxynitride. The grid having raised ridges may comprise a polymer material and/or a resin material. The raised ridges have a width of about 0.5 to 1 micrometer, or preferably, about 0.1 to 0.15 micrometer. The substrate may comprise a passivation layer having a multilayer interconnect structure; a layer of color filter disposed over the passivation layer; and a dielectric layer disposed over the layer of color filter.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a plurality of microlenses on a substrate, comprising:

providing a substrate having a plurality of photo sensors formed therein;

forming a passivation layer on the substrate and the plurality of photo sensors;

forming a dielectric layer on the passivation layer, the dielectric layer comprising a multilayer structure including a planarization layer, a polymeric color filter layer, and a spacer layer;

forming a photoresist pattern on the dielectric layer, wherein the photoresist pattern comprises a wall structure having a plurality of walls each having a width ranging between about 0.2 µm and 0.25 µm, and wherein forming the photoresist pattern includes:

depositing a first photoresist layer on the dielectric layer;

pre-baking the first photoresist layer;

exposing the pre-baked first photoresist layer;

post-baking the pre-baked and exposed first photoresist layer;

developing the pre-baked, exposed and post-baked first photoresist layer; and hard-baking the pre-baked, exposed, post-baked and developed first photoresist layer;

removing portions of the dielectric layer via wet and dry etching utilizing the photoresist pattern to form a dielectric grid between the photoresist pattern and a remaining portion of the dielectric layer, wherein the dielectric grid is composed of a plurality of raised ridges each having a width less than the width of a vertically-adjacent wall of the photoresist pattern wall structure and each defining an opening comprising an exposed area of the remaining portion of the dielectric layer;

removing the photoresist pattern via plasma ashing and wet stripping;

forming a plurality of photoresist features, wherein one of the raised ridges of the dielectric grid interposes each neighboring pair of the plurality of photoresist features, wherein each of a plurality of gaps separates each raised ridge of the dielectric grid from a neighboring one of the plurality of photoresist features, and wherein forming the plurality of photoresist features includes:
  depositing a second photoresist layer on the dielectric grid and the exposed areas of the remaining portion of the dielectric layer;
  pre-baking the second photoresist layer;
  exposing the pre-baked second photoresist layer;
  post-baking the pre-baked and exposed second photoresist layer;
  developing the pre-baked, exposed and post-baked second photoresist layer; and
  hard-baking the pre-baked, exposed, post-baked and developed second photoresist layer; and thermal reflowing the plurality of photoresist features at a temperature ranging between about 70° C. and about 140° C. to form a plurality of microlenses, wherein each of the plurality of microlenses has a convex upper surface having a thickness at its center ranging between about 0.5 μm and about 0.7 μm.

2. A method of manufacturing a plurality of microlenses on a substrate, comprising:
  providing a substrate having a plurality of photo sensors formed therein;
  forming a passivation layer on the substrate and the plurality of photo sensors;
  forming a dielectric layer on the passivation layer, the dielectric layer having a dielectric constant no greater than about 3.9;
  forming a photoresist pattern on the dielectric layer, wherein the photoresist pattern comprises a wall structure having a plurality of walls each having a width ranging between about 0.2 μm and 0.25 μm, and wherein forming the photoresist pattern includes:
    depositing a first photoresist layer on the dielectric layer;
    pre-baking the first photoresist layer;
    exposing the pre-baked first photoresist layer;
    post-baking the pre-baked and exposed first photoresist layer;
    developing the pre-baked, exposed and post-baked first photoresist layer; and
    hard-baking the pre-baked, exposed, post-baked and developed first photoresist layer;
  removing portions of the dielectric layer via wet and dry etching utilizing the photoresist pattern to form a dielectric grid between the photoresist pattern and a remaining portion of the dielectric layer, wherein the dielectric grid is composed of a plurality of raised ridges each having a width less than the width of a vertically-adjacent wall of the photoresist pattern wall structure and each defining an opening comprising an exposed area of the remaining portion of the dielectric layer;
  removing the photoresist pattern via plasma ashing and wet stripping;
  forming a plurality of photoresist features, wherein one of the raised ridges of the dielectric grid interposes each neighboring pair of the plurality of photoresist features, wherein each of a plurality of gaps separates each raised ridge of the dielectric grid from a neighboring one of the plurality of photoresist features, and wherein forming the plurality of photoresist features includes:
    depositing a second photoresist layer on the dielectric grid and the exposed areas of the remaining portion of the dielectric layer;
    pre-baking the second photoresist layer;
    exposing the pre-baked second photoresist layer;
    post-baking the pre-baked and exposed second photoresist layer;
    developing the pre-baked, exposed and post-baked second photoresist layer; and
    hard-baking the pre-baked, exposed, post-baked and developed second photoresist layer; and
  thermal reflowing the plurality of photoresist features at a temperature ranging between about 70° C. and about 140° C. to form a plurality of microlenses, wherein each of the plurality of microlenses has a convex upper surface having a thickness at its center ranging between about 0.5 μm and about 0.7 μm.

3. A method of manufacturing a plurality of microlenses on a substrate, comprising:
  providing a substrate having a plurality of photo sensors formed therein;
  forming a passivation layer on the substrate and the plurality of photo sensors;
  forming a dielectric layer on the passivation layer;
  forming a photoresist pattern on the dielectric layer, wherein the photoresist pattern comprises a wall structure having a plurality of walls, and wherein forming the photoresist pattern includes:
    depositing a first photoresist layer on the dielectric layer;
    pre-baking the first photoresist layer;
    exposing the pre-baked first photoresist layer;
    post-baking the pre-baked and exposed first photoresist layer;
    developing the pre-baked, exposed and post-baked first photoresist layer; and
    hard-baking the pre-baked, exposed, post-baked and developed first photoresist layer;
  removing portions of the dielectric layer via wet and dry etching utilizing the photoresist pattern to form a dielectric grid between the photoresist pattern and a remaining portion of the dielectric layer, wherein the dielectric grid is composed of a plurality of raised ridges each having a width less than the width of a vertically-adjacent wall of the photoresist pattern wall structure and each defining an opening comprising an exposed area of the remaining portion of the dielectric layer;
  removing the photoresist pattern via plasma ashing and wet stripping;
  forming a plurality of photoresist features, wherein one of the raised ridges of the dielectric grid interposes each neighboring pair of the plurality of photoresist features, wherein each of a plurality of gaps separates each raised ridge of the dielectric grid from a neighboring one of the plurality of photoresist features, and wherein forming the plurality of photoresist features includes:

depositing a second photoresist layer on the dielectric grid and the exposed areas of the remaining portion of the dielectric layer;

pre-baking the second photoresist layer;

exposing the pre-baked second photoresist layer;

post-baking the pre-baked and exposed second photoresist layer;

developing the pre-baked, exposed and post-baked second photoresist layer; and hard-baking the pre-baked, exposed, post-baked and developed second photoresist layer; and thermal reflowing the plurality of photoresist features to form a plurality of microlenses each having a convex upper surface.

* * * * *